United States Patent
Sancheti et al.

(10) Patent No.: US 7,113,445 B1
(45) Date of Patent: Sep. 26, 2006

(54) MULTI-PORT MEMORY CELL AND ACCESS METHOD

(75) Inventors: Sanjay Sancheti, Sunnyvale, CA (US); Jeffery Scott Hunt, Ackerman, MS (US); George M. Ansel, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 113 days.

(21) Appl. No.: 10/948,006

(22) Filed: Sep. 22, 2004

Related U.S. Application Data

(60) Provisional application No. 60/506,626, filed on Sep. 26, 2003.

(51) Int. Cl.
   *G11C 8/00* (2006.01)
(52) U.S. Cl. .................. 365/230.05; 365/154
(58) Field of Classification Search ............ None
   See application file for complete search history.

(56) References Cited

U.S. PATENT DOCUMENTS

| | | | |
|---|---|---|---|
| 5,804,986 A | 9/1998 | Jones | |
| 6,005,795 A | 12/1999 | Hawkins et al. | |
| 6,005,796 A | 12/1999 | Sywyk et al. | |
| 6,181,595 B1 | 1/2001 | Hawkins et al. | |
| 6,262,912 B1 | 7/2001 | Sywyk et al. | |
| 6,388,939 B1 | 5/2002 | Manapat et al. | |
| 6,473,357 B1 | 10/2002 | Fan et al. | |
| 6,717,844 B1 * | 4/2004 | Ohtani | 365/158 |
| 6,731,566 B1 | 5/2004 | Sywyk et al. | |
| 6,816,955 B1 | 11/2004 | Raza et al. | |
| 6,873,565 B1 * | 3/2005 | Riedlinger et al. | 365/230.05 |
| 6,914,845 B1 * | 7/2005 | Ooishi | 365/229 |

OTHER PUBLICATIONS

U.S. Appl. No. 10/949,537, Chen et al.

* cited by examiner

*Primary Examiner*—Tan T. Nguyen
(74) *Attorney, Agent, or Firm*—Bradley T. Sako

(57) ABSTRACT

A multi-port memory cell (200) can be formed from seven transistors. Single ended write operations can be performed without a boosted word line voltage or variable power supply. A data value (D/DB) stored in the memory cell (200) can be cleared by shorting complementary data nodes (204-0 and 204-1) together. Write data can then be placed on a bit line. Complementary data nodes (204-0 and 204-1) can then be isolated once again, resulting in the write data being latched within the memory cell (300). An access method (700) for a multi-port memory cell is also described.

20 Claims, 4 Drawing Sheets

MULTI-PORT MEMORY CELL AND ACCESS METHOD

This application claims the benefit of U.S. provisional patent application Ser. No. 60/506,626, filed Sep. 26, 2003.

TECHNICAL FIELD

The present invention relates generally to electronic circuits, and more particularly to dual-port and multi-port memory cell circuits.

BACKGROUND OF THE INVENTION

Multi-port memory devices, including dual-port devices, can be preferred over single-port memory devices, as data values can be read and written simultaneously.

To better understand various aspects and advantages of the disclosed embodiments, two conventional dual-port type memory cells will now be described.

A first conventional dual-port type memory cell is set forth in FIG. 8, and designated by the general reference character 800. The example of FIG. 8 shows a "true" eight transistor (8-T) dual-port cell. The memory cell 800 includes cross-coupled inverters INV1 and INV2, each of which can be a complementary-metal-oxide-semiconductor (CMOS) inverter, and thus include two transistors. Inverters (INV1 and INV2) can form a latch, or flip—flip, that stores a data value on complementary data nodes (D and DB). A dual-port capability is provided by access transistors M1 to M4. Transistors M1 and M2 can be commonly enabled by a first word line WL1 to read or write data for a first port by way of complementary bit lines BL1 and BLB1. Similarly, transistors M3 and M4 can be commonly enabled by a second word line WL2 to read or write data for a second port by way of complementary bit lines BL2 and BLB2.

A drawback to the conventional arrangement of FIG. 8 can be the resulting signal routing needed. In particular, such an arrangement typically requires two pairs (four total) of metal routes for the bit line pairs (BL1/BLB1 and BL2/BLB2). This can lead to undesirable crowding at such a metal layer.

A second conventional dual-port type memory cell is set forth in FIG. 9, and designated by the general reference character 900. The example of FIG. 9 shows a "quasi" dual-port cell that can be implemented with six transistors. Like the 8-T cell of FIG. 8, memory cell 900 also includes cross-coupled inverters INV1 and INV2. A quasi dual-port capability is provided by access transistors M8 and M9. Transistor M8 is activated by a first word line WL1, to read or write data for a first port by way of bit line BL1. Transistor M9 is activated by a second word line WL2 to read or write data for a second port by way of bit line BLB2.

While the conventional arrangement of FIG. 9 can provide a more compact cell (i.e., six transistors instead of eight), such an arrangement can have drawbacks.

A drawback to the arrangement of FIG. 9 can be specialized circuitry, multiple operating voltages, additional process steps and/or decreased reliability that may be needed to properly write data into the cell. In particular, because a write operation only provides data via a single bit line (BL1 or BLB2), a write operation must be capable of forcing a latch (INV1/INV2) into a data state from only one data node (D or DB). In order to ensure that a write voltage is sufficiently high, a boosted gate voltage can be applied to the access transistor (M8 or M9). Thus, the circuit of FIG. 9 can require "boosted" (higher than supply) gate voltages and/or a dynamic power supply. Such higher operating voltages can require extra process steps, such as increased gate oxide thickness, as but one example. If increased gate oxide thickness is not employed, such higher operating voltages can stress gate oxide layers, decreasing reliability.

Another drawback to the arrangement of FIG. 9 can be slower performance. The memory cell 900 of FIG. 9 is not a "true" dual-port cell in that accesses to the cell are typically multiplexed.

In light of the above, it would be desirable to arrive at some sort of multi-port memory cell that has a more compact structure than a conventional 8-T dual-port cell, but does not suffer from the various drawbacks of a 6-T quasi dual-port cell.

SUMMARY OF THE INVENTION

According to the embodiments, a multi-port memory cell can be smaller in area and faster in operation than conventional solutions, while still providing READ/WRITE operations from both ports simultaneously. In one arrangement, a memory cell can include seven transistors.

The present invention can include a multi-port memory cell having a latch-type circuit that stores complementary data values on first and second data nodes. The memory cell can also include a clear device that couples the first and second data nodes together in response to a clear signal. Each access device can couple a respective data node to one particular bit line in response to a different word line signal.

Such an arrangement can allow for single ended write operations that do not require a boosted voltage or a variable power supply, as a clearing device can precondition the latch-type circuit to an indeterminate state for easier writing.

According to one aspect of the embodiments, a latch-type circuit can comprise cross-coupled inverters.

According to another aspect of the embodiments, a clear device can comprise a transistor having a source-drain path coupled between the first and second data nodes.

Such an arrangement can allow a clearing function to be executed with a relatively small device.

According to another aspect of the embodiments, a clear device can comprise a p-channel transistor and access devices can each comprise an n-channel transistor having source-drain paths coupled to the respective data node. In another arrangement, a clear device can comprises an n-channel transistor, and access devices can each comprise a p-channel transistor having source-drain paths coupled to the respective data node.

In such an arrangement, a clearing device can avoid introducing a threshold voltage drop between data nodes in a clear operation.

According to another aspect of the embodiments, two or more access devices can be coupled to the same data node to provide more than two ports for the memory cell.

The present invention can also include a multi-port memory device that includes a plurality of memory cells arranged into rows, each memory cell of the same row being commonly coupled to at least a first word line that provides access to a first data node of each cell and a second word line that provides access to a second data node of each cell. In addition, each memory cell of the same row can have a clear device that couples the first and second data nodes of each cell to one another in response to a clear line corresponding to the row.

In this way, clear operations can be implemented on a row-by-row basis.

According to one aspect of the embodiments, first word lines, second word lines, and clear lines are parallel with one another in the row direction.

In this way, the addition of a clear function does not affect signal routing in the bit line (i.e., column) direction.

According to another aspect of the embodiments, first word lines can provide access according to an access voltage that is not greater than a high power supply voltage of the device. In addition, clear lines can activate clear devices according to low voltage that is not less than a low power supply voltage of the device. Alternatively, first word lines provide access according to an access voltage that is not less than a low power supply voltage of the device, and clear lines activate clear devices according to a high voltage that is not greater than a high power supply voltage of device.

In this way, the present invention can provide a multi-port memory device with a compact cell structure that does not require specialized boosted power supply voltages, or the like.

According to another aspect of the embodiments, first word lines can provide access in a read operation according to a read voltage and access in write operation according to a write voltage. In addition, the write voltage can be no greater in magnitude than the read voltage.

In this way, the present invention can provide a multi-port memory device with a compact cell structure that does not require different word line voltages between read and write operations.

The present invention can also include a multi-port memory cell device accessing method. The method can include, in a write operation, coupling one of two complementary data nodes of the multi-port memory cell to a selected bit line, coupling the complementary data nodes of the multi-port memory cell to one another, and driving the selected bit line to a write logic value. Complementary data nodes can then be isolated from one another.

In this way, single ended writes can be accomplished utilizing a clearing operation that couples complementary data nodes to one another.

According to one aspect of the embodiments, the step of coupling one data node to the selected bit line can include driving one of a plurality of word lines coupled to the memory cell to a high write voltage to enable an n-channel transistor disposed between the selected bit line and the one data node.

According to another aspect of the embodiments, in a read operation, the method can include driving one of a plurality of word lines coupled to the memory cell to a read voltage, wherein the high write voltage is no greater than the read voltage.

According to another aspect of the embodiments, the step of coupling one data node to the selected bit line can include driving one of a plurality of word lines coupled to the memory cell to a low write voltage to enable a p-channel transistor disposed between the bit line and the one data node.

According to another aspect of the embodiments, in a read operation, the method can include driving one of a plurality of word lines coupled to the memory cell to a read voltage, wherein the low write voltage is no less than the read voltage.

According to another aspect of the embodiments, the step of coupling complementary data nodes of the multi-port memory cell to one another comprises driving a clear line coupled to the memory cell to a low voltage to enable a p-channel transistor disposed between the complementary data nodes.

According to another aspect of the embodiments the step of coupling complementary data nodes of the multi-port memory cell to one another comprises driving a clear line coupled to the memory cell to a high voltage to enable an n-channel transistor disposed between the complementary data nodes.

According to another aspect of the embodiments, a method can further include, after isolating the complementary nodes from one another, isolating the selected bit line from the one data node.

According to another aspect of the embodiments, a method can further include, in a simultaneous read operation, driving a plurality of word lines coupled to the multi-port memory cell to a read voltage to couple the data nodes to a plurality of bit lines, each bit line corresponding to a different word line.

DETAILED DESCRIPTION

Various embodiments of the present invention will now be described in detail with reference to a number of drawings. The embodiments include a multi-port memory cell that can have a more compact size that an eight-transistor memory cell, but not require the specialized circuitry or processes.

Figure 1:
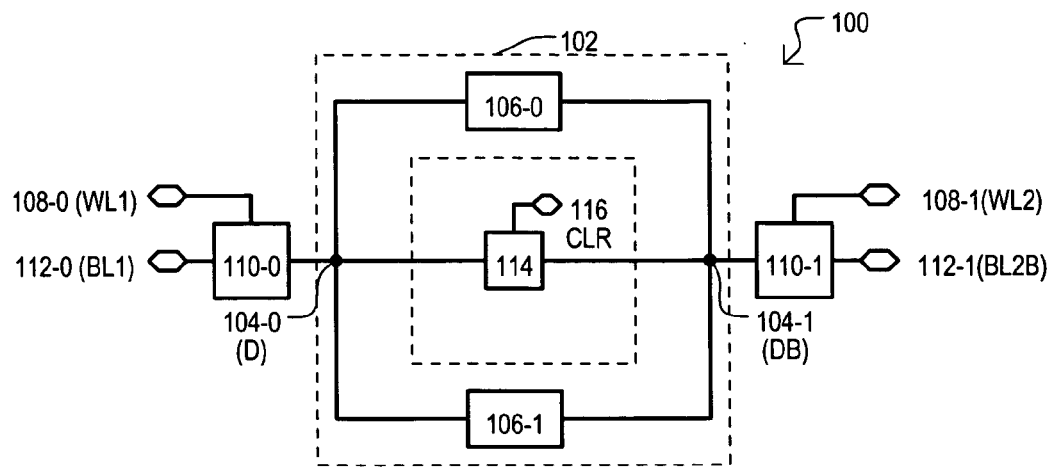
FIG. 1 is a block schematic diagram of a first embodiment of the present invention.

A general circuit arrangement of a multi-port memory cell according to one embodiment is set forth in FIG. 1 and designated by the general reference character 100. A memory cell 100 can include a latch (i.e., flip-flop) type circuit 102 that can store complementary data values D and DB at nodes 104-0 and 104-1. In the arrangement shown, a latch type circuit 102 can include store portions 106-0 and 106-1.

A first word line (WL1) 108-0 can provide access to a first node 104-0 by operation of access device 110-0. In particular, first word line WL1 can activate access device 110-0. When activated, access device 110-0 can connect a first bit line (BL1) 112-0 to first node 104-0. In the same general fashion, a second word line (WL2) 108-1 can provide access to second node 104-1 by operation of access device 110-1 connected to second bit line (BL2B) 112-1.

Unlike a conventional arrangement, a memory cell 100 can also include a "clear" device 114 connected to a clear line 116. When activated according to a clear line 116, clear device 114 can connect complementary data nodes 104-0 and 104-1 to one another. Such a clearing operation can place data nodes (104-0 and 104-1) in a state that is more conducive to write operations. More particularly, both data nodes (104-0 and 104-1) can be placed at an intermediate logic level, thus a write operation does not have to overcome an existing latched logic state.

By activating a clear device 114, a latch type circuit 102 can be preconditioned to the intermediate logic state. Thus, a subsequent write operation can establish a logic state within latch type circuit 102 with relatively low bit line voltage levels. As a result, such an arrangement need not rely on boosted gate voltages or variable power supplies, as an existing power supply level can be sufficient to write data into the memory cell.

Figure 2:
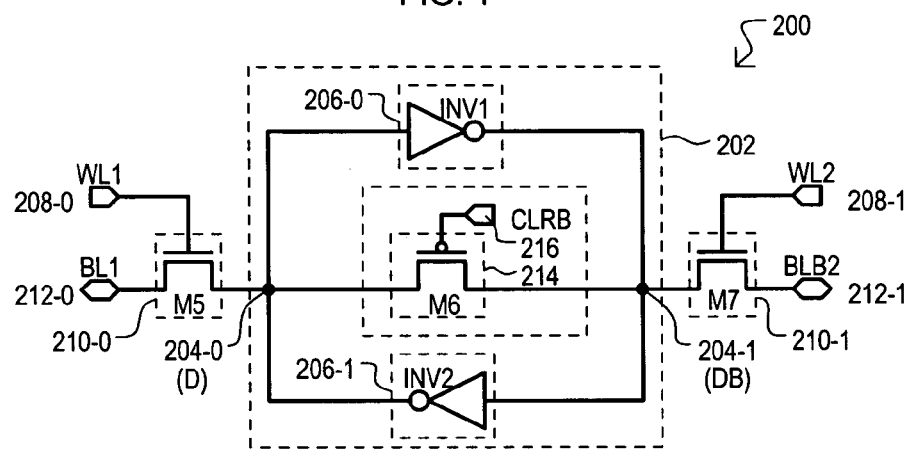
FIG. 2 is a schematic diagram of a second embodiment of the present invention.
Figure 3:
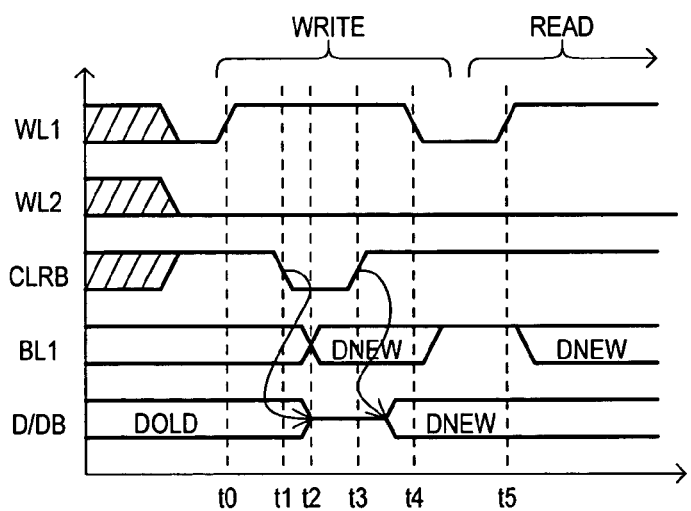
FIG. 3 is a timing diagram showing the operation of the second embodiment.

A second embodiment of the present invention will now be described with reference to FIGS. 2 and 3. FIG. 2 is a schematic diagram of a two-port memory cell according to a second embodiment. FIG. 3 is a timing diagram showing the operation of the second embodiment.

A second embodiment 200 can include some of the same general circuit sections as the first embodiment of FIG. 1. Accordingly, similar sections of the circuit will be referred to by the same reference character but with the first digit being a "2" instead of a "1".

In the second embodiment 200, a latch-type circuit 202 can be formed by cross-coupled inverters (206-0 and 206-1). Access device 210-0 can include an n-channel insulated gate field effect transistor (e.g., MOSFETs) M5 having a source-drain path connected between a bit line 212-0 and a first data node 204-0, and a gate that receives a word line WL1. Similarly, access devices 210-1 can include n-channel transistor M7 having a source-drain path connected between a bit line 212-1 and a second data node 204-1, and a gate that receives a word line WL2.

A clear device 214 can include a p-channel transistor M6 having a source-drain path connected between data nodes 204-0 and 204-1, and a gate connected to clear line CLRB. Including a clear device with a transistor having the opposite conductivity of the access devices can prevent introducing a threshold voltage drop between data nodes 204-0 and 204-1 in a clear operation.

Referring now to FIG. 3, a timing diagram shows a write operation followed by a read operation for the circuit of FIG. 2.

At time t0, a first word line WL1 can be driven to an active level. In the example shown, this can turn on access device 210-0. As a result, data node 204-0 can be connected to a first bit line BL1.

Figure 9:
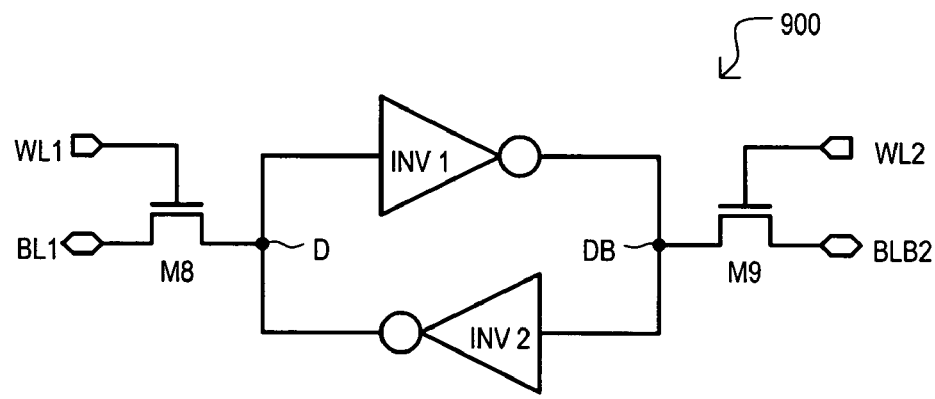
FIG. 9 is a schematic diagram of a conventional six-transistor quasi dual-port memory cell.

At time t1, a clear line CLRB can be driven to active level, in this example a low clear voltage. This can turn on clear device 214. As a result, data node 204-0 can be connected data node 204-1. Consequently, data values D and DB can be placed into an intermediate logic state. Such an intermediate logic state can be more conducive to write operations, as a lower word line voltage is needed to force a logic state into latch circuit 202 in the event the data value would have to be "flipped", as compared to a conventional approach, like that of FIG. 9.

At time t2, a bit line BL1 can be driven with a desired write data value. This is shown as DNEW in FIG. 3.

At time t3, a clear line CLRB returns to an inactive level. As result, data nodes (204-0 and 204-1) can be isolated from one another. This can result in the write data value on bit line BL1 forcing the latch-type circuit 202 into the new data state DNEW. In this way, data can be written into a memory cell in a single-ended fashion.

At time t4, word line WL1 can return to an inactive level, thus isolating bit line BL1 from data node 204-0.

After a write operation, bit lines (BL1 and BLB2) can return to some predetermined value. This is shown in FIG. 3 as a high level, but can include an intermediate precharge level, or the like.

At time t5, word line WL1 can return high once again for a read operation. Access device 210-0 can couple data node 204-0 to a bit line BL1 for subsequent output via a first port. It is noted that the high read voltage can be essentially the same as the high write voltage. This illustrates how different word line voltages are not needed for read and write operations.

Figure 4:
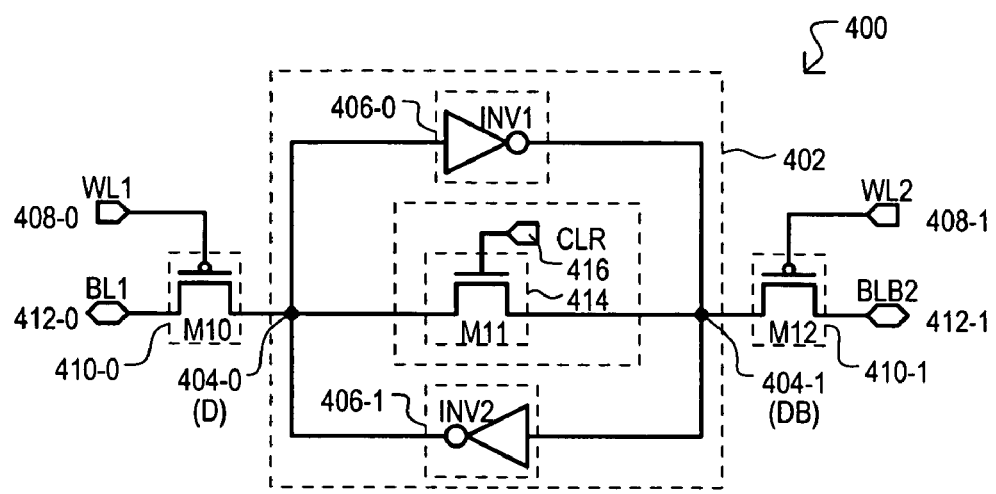
FIG. 4 is a schematic diagram of a third embodiment of the present invention.
Figure 5:
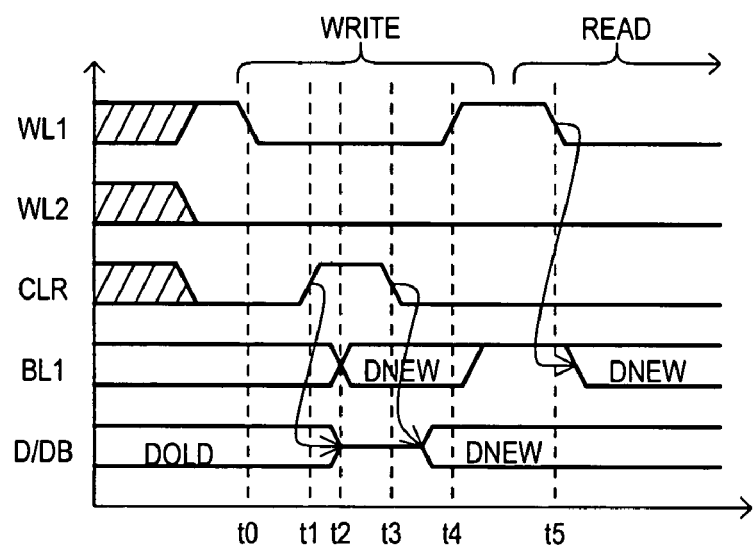
FIG. 5 is a timing diagram showing the operation of the third embodiment.

A third embodiment of the present invention will now be described with reference to FIGS. 4 and 5. FIG. 4 is a schematic diagram of a two-port memory cell according to a third embodiment. FIG. 5 is a timing diagram showing the operation of the third embodiment.

Referring now to FIG. 4, a dual port memory cell 400 can have the same general arrangement as FIG. 2. Accordingly, similar sections of the circuit will be referred to by the same reference character but with the first digit being a "4" instead of a "2".

The embodiment of FIG. 4 differs from that of FIG. 2 in that access devices 410-0 and 410-1 can include p-channel transistors M10 and M12, while clear device 414 can include an n-channel transistor M11.

As a result of these differences, word lines 408-0 and 408-1 can have an active low value, while clear line 416 can have an active high value.

FIG. 5 shows the same operation as FIG. 3. The waveforms of FIG. 5 can essentially follow those of FIG. 3, with the above changes in active signal levels.

FIG. 5 also illustrates how word line voltage levels need not be boosted to above (or below) supply levels.

The embodiments of FIGS. 2 and 4 both illustrate seven transistor memory cells. Such embodiments can thus provide a smaller solution than the conventional 8-T cell. At the same time, the embodiments may not suffer from the various disadvantages of a 6-T cell approach, as noted above.

While the above embodiments have illustrated dual-port memory cells, the present invention should not be construed as being limited to only two ports. The disclosed memory cell architectures can be extensible to an arbitrary multi-port memory cell with more than two access ports. In such a case, additional access devices (e.g., 110-0/1, 210-0/1 and 410-0/1) can be connected to either complementary data node.

Advantages of the seven-transistor embodiment disclosed above, can include an approximately 25% area savings when compared to the conventional 8-T cell.

In addition, as noted above, the seven transistor cell can generally follow a 6-T cell like structure, yet not require a boosted gate, dynamic supply (power, ground) or multi-plexed access.

An additional advantage is that a single ended write of (1 and 0) is possible.

Figure 6:
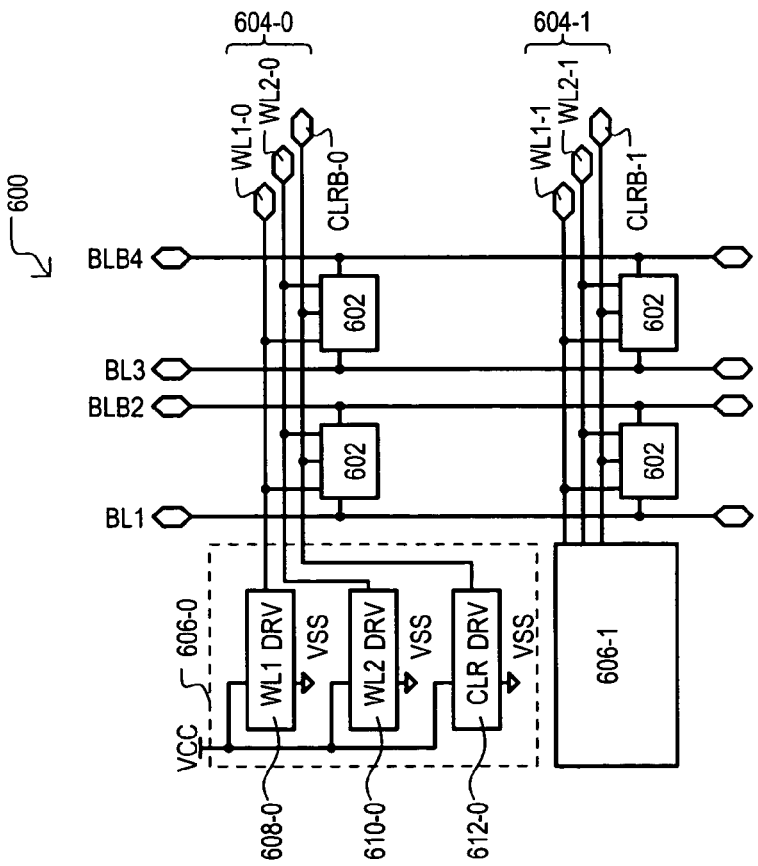
FIG. 6 is a block schematic diagram of a memory device according to another embodiment of the present invention.
Figure 8:
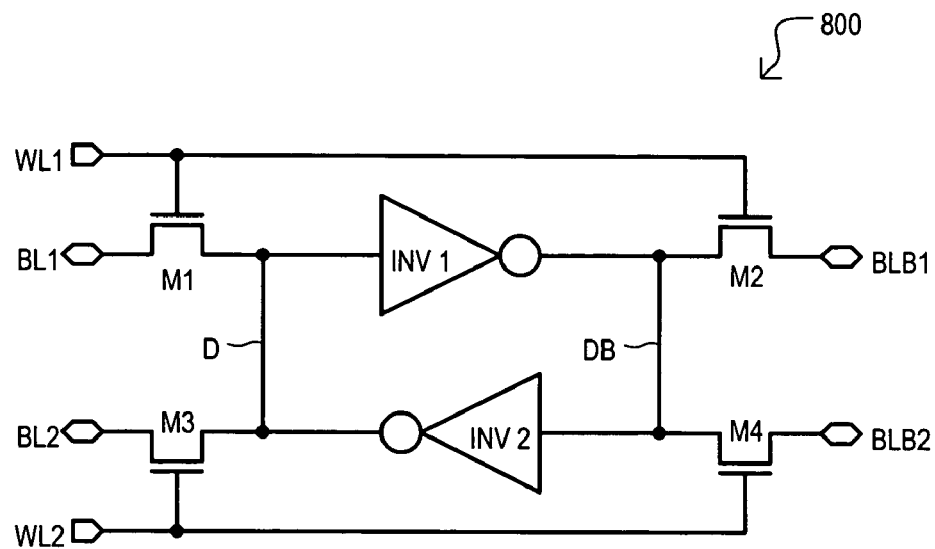
FIG. 8 is a schematic diagram of a conventional eight-transistor dual-port memory cell.

While a multi-port cell like those of the above embodiments can be employed as custom portions of an integrated circuit, preferably, such memory cells can be included in an array to form a multi-port static random access memory (SRAM). One very particular example of a dual-port SRAM is shown in FIG. 6, and designated by the general reference character 600.

An SRAM 600 can include a number of memory cells 602, which may take the form of any of the previous embodiments. Memory cells 602 of a same row 604-0 and 604-1 can be commonly connected to a same first word line (e.g., WL1-0, WL1—1), second word line (e.g., WL2-0, WL2-1) and clear line (e.g., CLRB-0, CLRB-1).

Word line and clear line signals can be applied by a row driver 606-0, 606-1 corresponding to each row (604-0 and 604-1). In the very particular example of FIG. 6, each row driver (606-0, 606-1) can include a signal driver corresponding to each row signal line. Thus, row driver 606-0 is shown to include first word line driver 608-0, a second word line driver 610-0, and a clear line driver 612-0.

Each signal driver (608-0, 610-0 and 612-0) can receive a high power supply VCC and a lower power supply VSS. Further, such circuits do not include any specialized connections to a boosted power supply, or any internal circuits for generating a high power supply voltage (e.g., "self" booting word lines).

That is, signal drivers (608-0, 610-0 and 612-0) can drive their respective lines between VCC and VSS, where neither voltage is a boosted power supply. More particularly, VCC and VSS can be external power supplies provided to the device, or an array power supply provided to the memory cell array. An array power supply can typically include a "stepped" down power supply that is less than VCC.

Figure 7:
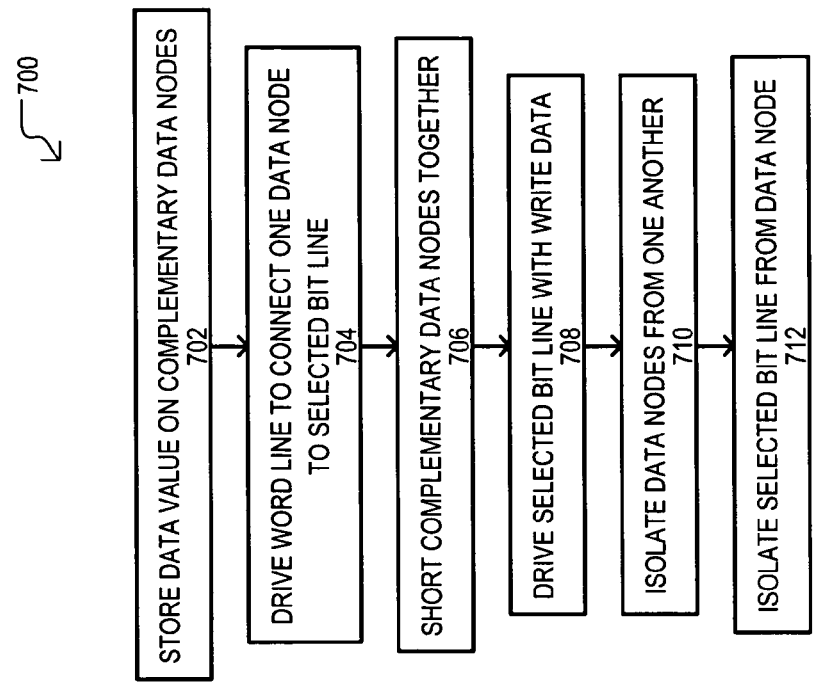
FIG. 7 is a flow diagram showing a method of accessing a multi-port memory cell according to one embodiment.

The present invention can also include a method of accessing a multi-port memory cell according to the various operations described above. One very particular example of a single-ended write operation is set forth in FIG. 7, and designated by the general reference character 700.

A method 700 can include storing a data value on complementary data nodes (step 702). A word line can then be driven to connect one data node to a selected bit line (step 704). At this point "old" data can remain present at the complementary data nodes.

The data nodes can then be shorted together (step 706). This can clear the "old" data value, placing both data nodes to an intermediate data state, and preconditioning the memory cell for write data. The selected bit line can then be driven with write data (step 708). In this way, write data can be presented at one end of the memory cell.

With write data now present, the data nodes can be isolated from one another (step 710). As a result, write data can be latched in the memory cell, and "new" data can now be present in the memory cell.

The selected bit line can then be isolated from the data node (step 712). This can complete the single-ended write operation.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A multi-port memory cell, comprising:
a latch-type circuit that stores complementary data values on first and second data nodes;
a clear device comprising at least one transistor of a first conductivity type that couples the first and second data nodes together in response to a clear signal; and
a plurality of access devices, each access device comprising at least one transistor of a second conductivity type and coupling a respective data node to one particular bit line in response to a different word line signal.

2. The multi-port memory cell of claim 1, wherein:
the latch-type circuit comprises cross-coupled inverters.

3. The multi-port memory cell of claim 1, wherein:
the clear device comprises a transistor having a source-drain path coupled between the first and second data nodes.

4. The multi-port memory cell of claim 3, wherein:
the clear device comprises a p-channel transistor; and
the access devices each comprise an n-channel transistor having source-drain paths coupled to the respective data node.

5. The multi-port memory cell of claim 3, wherein:
the clear device comprises an n-channel transistor; and
the access devices each comprise a p-channel transistor having source-drain paths coupled to the respective data node.

6. The multi-port memory cell of claim 1, wherein:
the plurality of access devices includes at least two access devices coupled to the same data node to provide more than two access ports for the memory cell.

7. A multi-port memory device, comprising:
a plurality of memory cells arranged into rows, each memory cell of the same row being commonly coupled to at least a first word line that provides access to a first data node of each cell and a second word line that provides access to a second data node of each cell; wherein
each memory cell of the same row includes a clear device that couples a clear transistor the first and second data nodes of the memory cell to one another in response to a clear line of the corresponding row, a first access device that provides the access to the first data node, and a second access device that provides the access to the second data node, the first and second access devices comprising transistors of a different conductivity than the clear transistor.

8. The multi-port memory device of claim 7, wherein:
the first word lines, second word lines, and clear lines are parallel with one another in the row direction.

9. The multi-port memory device of claim 7, wherein:
the first word lines provide access according to an access voltage that is not greater than a high power supply voltage of the device; and
the clear lines activate the clear devices according to low voltage that is not less than low power supply voltage of the device.

10. The multi-port memory device of claim 7, wherein:
the first word lines provide access according to an access voltage that is not less than a low power supply voltage of the device; and
the clear lines activate clear devices according to a high voltage not greater than a high power supply voltage of device.

11. The multi-port memory device of claim 7, wherein:
first word lines provide access in a read operation according to a read voltage and access in write operation according to a write voltage, the write voltage being no greater in magnitude than the read voltage.

12. A multi-port memory cell accessing method, comprising the steps of:
in a write operation,
coupling one of two complementary data nodes of the multi-port memory cell to a selected bit line via an access transistor of a first conductivity type,
coupling the complementary data nodes of the multi-port memory cell to one another to place the data nodes into an intermediate logic state via a clear transistor of a second conductivity type,
driving the selected bit line to a write data value, and
isolating the complementary data nodes from one another to place the data nodes into complementary logic states according to the write data value.

13. The method of claim 12, wherein:
the step of coupling one data node to the selected bit line comprises driving one of a plurality of word lines coupled to the memory cell to a high write voltage to enable an n-channel transistor disposed between the selected bit line and the one data node.

14. The method of claim 13, further including:
in a read operation,
driving one of a plurality of word lines coupled to the memory cell to a read voltage to enable an n-channel transistor disposed between the selected bit line and the one data node, wherein
the high write voltage is no greater than the read voltage.

15. The method of claim 12, wherein:
step of coupling one data node to the selected bit line comprises driving one of a plurality of word lines coupled to the memory cell to a low write voltage to enable a p-channel transistor disposed between the bit line and the one data node.

16. The method of claim 15, further including:
in a read operation, driving one of a plurality of word lines coupled to the memory cell to a low read voltage to enable a p-channel transistor disposed between the bit line and the one data node, wherein
the low write voltage is no less than the read voltage.

17. The method of claim 12, wherein:
the step of coupling complementary data nodes of the multi-port memory cell to one another comprises driving a clear line coupled to the memory cell to a low voltage to enable a p-channel transistor disposed between the complementary data nodes.

18. The method of claim 12, wherein:
the step of coupling complementary data nodes of the multi-port memory cell to one another comprises driving a clear line coupled to the memory cell to a high voltage to enable an n-channel transistor disposed between the complementary data nodes.

19. The method of claim 12, further including:
after isolating the complementary nodes from one another, isolating the selected bit line from the one data node.

20. The method of claim 12, further including:
in a simultaneous read operation, driving a plurality of word lines coupled to the multi-port memory cell to a read voltage to couple the data nodes to a plurality of bit lines, each bit line corresponding to a different word line.

* * * * *